United States Patent
Romero et al.

(10) Patent No.: US 11,467,235 B1
(45) Date of Patent: Oct. 11, 2022

(54) REDUCING STRAY MAGNETIC FIELD EFFECTS USING A MAGNETIC FIELD FEEDBACK

(71) Applicant: Allegro MicroSystems, LLC, Manchester, NH (US)

(72) Inventors: Hernán D. Romero, Buenos Aires (AR); Octavio H. Alpago, Ciudad de Buenos Aires (AR)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 17/333,235

(22) Filed: May 28, 2021

(51) Int. Cl.
    G01R 33/09 (2006.01)
    H03H 17/06 (2006.01)

(52) U.S. Cl.
    CPC ......... *G01R 33/098* (2013.01); *G01R 33/093* (2013.01); *H03H 17/0671* (2013.01)

(58) Field of Classification Search
    CPC . G01R 33/098; G01R 33/093; H03H 17/0671
    See application file for complete search history.

(56) References Cited

U.S. PATENT DOCUMENTS

| 6,445,171 B2 * | 9/2002 | Sandquist | G01R 15/205 607/66 |
| 10,444,299 B2 | 10/2019 | Romero et al. | |
| 10,481,219 B2 | 11/2019 | Romero et al. | |
| 10,917,092 B2 | 2/2021 | Romero | |
| 2009/0115412 A1 * | 5/2009 | Fuse | G01R 33/09 33/355 R |
| 2013/0335065 A1 * | 12/2013 | Fugate | G01R 33/0047 324/202 |
| 2016/0161531 A1 * | 6/2016 | Avery | G01R 15/205 324/252 |
| 2018/0340986 A1 | 11/2018 | Latham et al. | |
| 2019/0265018 A1 | 8/2019 | Latham et al. | |
| 2019/0312579 A1 * | 10/2019 | Romero | G01R 33/077 |

OTHER PUBLICATIONS

U.S. Appl. No. 16/870,265, filed May 8, 2020, Romero, et al.
U.S. Appl. No. 17/186,346, filed Feb. 26, 2021, Romero.
U.S. Appl. No. 17/140,429, filed Jan. 4, 2021, Romero.

\* cited by examiner

*Primary Examiner* — Alvaro E Fortich
(74) *Attorney, Agent, or Firm* — Daly, Crowley, Mofford & Durkee, LLP (57) ABSTRACT

In one aspect, a magnetic-field sensor includes main coil circuitry configured to generate a first magnetic-field signal at a first frequency; a first channel; a second channel; a subtractor circuit configured to subtract a second channel output signal from a first channel output signal to form a subtraction signal; an adder circuit configured to combine the first channel output signal and the second channel output signal to form a summation signal; processing circuitry configured to receive the summation signal and to provide a magnetic-field sensor output signal indicating a position of the target; feedback circuitry configured to receive the subtraction signal and to provide a first feedback signal to the processing circuitry, and a second feedback signal; and a secondary coil circuitry configured to receive the second feedback signal and to generate, based on the second feedback signal, a second magnetic-field signal to reduce the first magnetic-field signal received.

38 Claims, 10 Drawing Sheets

REDUCING STRAY MAGNETIC FIELD EFFECTS USING A MAGNETIC FIELD FEEDBACK

BACKGROUND

There are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

A linear range refers to a range where changes in a magnetic-field intensity is linear with changes in resistance. Some magnetoresistance elements, such as a TMR, have a limited linear range.

Magnetic-field sensors are often used to detect a ferromagnetic target. Magnetic-field sensors generally act as sensors to detect motion or position of the target. Such sensors are found in many areas of technology including robotics, automotive, manufacturing and so forth. For example, a magnetic field sensor may be used to detect when a vehicle's wheel locks up, triggering the vehicle's control processor to engage the anti-lock braking system. In this example, the magnetic-field sensor may detect rotation of the wheel. Magnetic-field sensors may also detect distance to an object. For example, a magnetic-field sensor may be used to detect the position of a hydraulic piston.

SUMMARY

In one aspect, a magnetic-field sensor includes main coil circuitry configured to generate a first magnetic-field signal at a first frequency; a first channel; a second channel; a subtractor circuit configured to subtract a second channel output signal from a first channel output signal to form a subtraction signal; an adder circuit configured to combine the first channel output signal and the second channel output signal to form a summation signal; processing circuitry configured to receive the summation signal and to provide a magnetic-field sensor output signal indicating a position of the target; feedback circuitry configured to receive the subtraction signal and to provide a first feedback signal to the processing circuitry and to provide a second feedback signal to secondary coil circuitry; and the secondary coil circuitry configured to receive the second feedback signal and to generate, based on the second feedback signal, a second magnetic-field signal to reduce the first magnetic-field signal received at the first magnetoresistance circuitry. A reflected signal is generated from a target caused by the first magnetic-field signal. The first channel includes a first magnetoresistance circuitry configured to receive the reflected signal and the first magnetic-field signal; a first analog circuitry configured to receive an output signal from the first magnetoresistance circuitry; and a first filter configured to receive an output signal from the first analog circuitry and to provide the first channel output signal. A second channel includes a second magnetoresistance circuitry configured to receive the reflected signal and the first magnetic-field signal; a second analog circuitry configured to receive an output signal from the second magnetoresistance circuitry; and a second filter configured to receive an output signal from the second analog circuitry and to provide a second channel output signal.

In another aspect, a magnetic-field sensor includes main coil circuitry configured to generate a first magnetic-field signal at a first frequency, wherein a reflected signal is generated from a target caused by the first magnetic-field signal; a first channel that includes a first magnetoresistance circuitry configured to receive the reflected signal and the first magnetic-field signal, and a first analog circuitry configured to receive an output signal from the first magnetoresistance circuitry and to provide a first channel output signal; a second channel that includes a second magnetoresistance circuitry configured to receive the reflected signal and the first magnetic-field signal, and a second analog circuitry configured to receive an output signal from the second magnetoresistance circuitry and to provide a second channel output signal; a subtractor circuit configured to subtract the second channel output signal from the first channel output signal to form a subtraction signal; an adder circuit configured to combine the first channel output signal and the second channel output signal to form a summation signal; a first additional analog circuitry configured to receive the subtraction signal and to provide a first digital output signal to processing circuitry and to provide an analog signal to feedback circuitry; a second additional analog circuitry configured to receive the summation signal and to provide a second digital output signal to the processing circuitry; the feedback circuitry configured to receive the analog signal and to provide a first feedback signal to the first additional analog circuitry and a second feedback signal to secondary coil circuitry; the secondary coil circuitry configured to receive the second feedback signal and to generate, based on the second feedback signal, a second magnetic-field signal to reduce the first magnetic-field signal received at the first magnetoresistance circuitry; and the processing circuitry configured to receive the first and second digital signals and to provide a magnetic-field sensor output signal indicating a position of the target.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Described herein are techniques to fabricate a magnetic-field sensor to reduce stray magnetic-field effects. Stray magnetic fields can adversely affect the sensitivity of some magnetoresistance elements. In one example, a main coil may transmit a magnetic-field signal (sometimes referred to herein as direct coupling field signal (DCFS)) to a target. The reflected signal (sometimes referred to herein as a reflected field signal (RFS)) from the target is received by the magnetic-field sensor and, in particular, by at least two magnetoresistance circuitry components. However, the at least two magnetoresistance circuitry components may also receive the DCFS, which would be a stray magnetic field since the desired signal is the RFS from the target.

In one particular example, the magnetic-field sensor described herein includes a feedback loop that provides a secondary magnetic-field signal to compensate for stray magnetic-field components (e.g., reducing the effects of the DCFS generated by the main coil circuitry). As will be further described herein, the feedback may start in the analog domain or in the digital domain. Further, the non-linear behavior of certain magnetoresistance elements in a bridge may be masked by the magnetic-field closed-loop approach described herein.

As used herein, the term "magnetic-field sensor" is used to describe a circuit that uses a magnetic field sensing element, generally in combination with other circuits. Magnetic-field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic-field density of a magnetic field.

As used herein, the term "target" is used to describe an object to be sensed or detected by a magnetic-field sensor or a magnetoresistance element. The target may include a conductive material that allows for eddy currents to flow within the target, for example a metallic target that conducts electricity.

Figure 1:
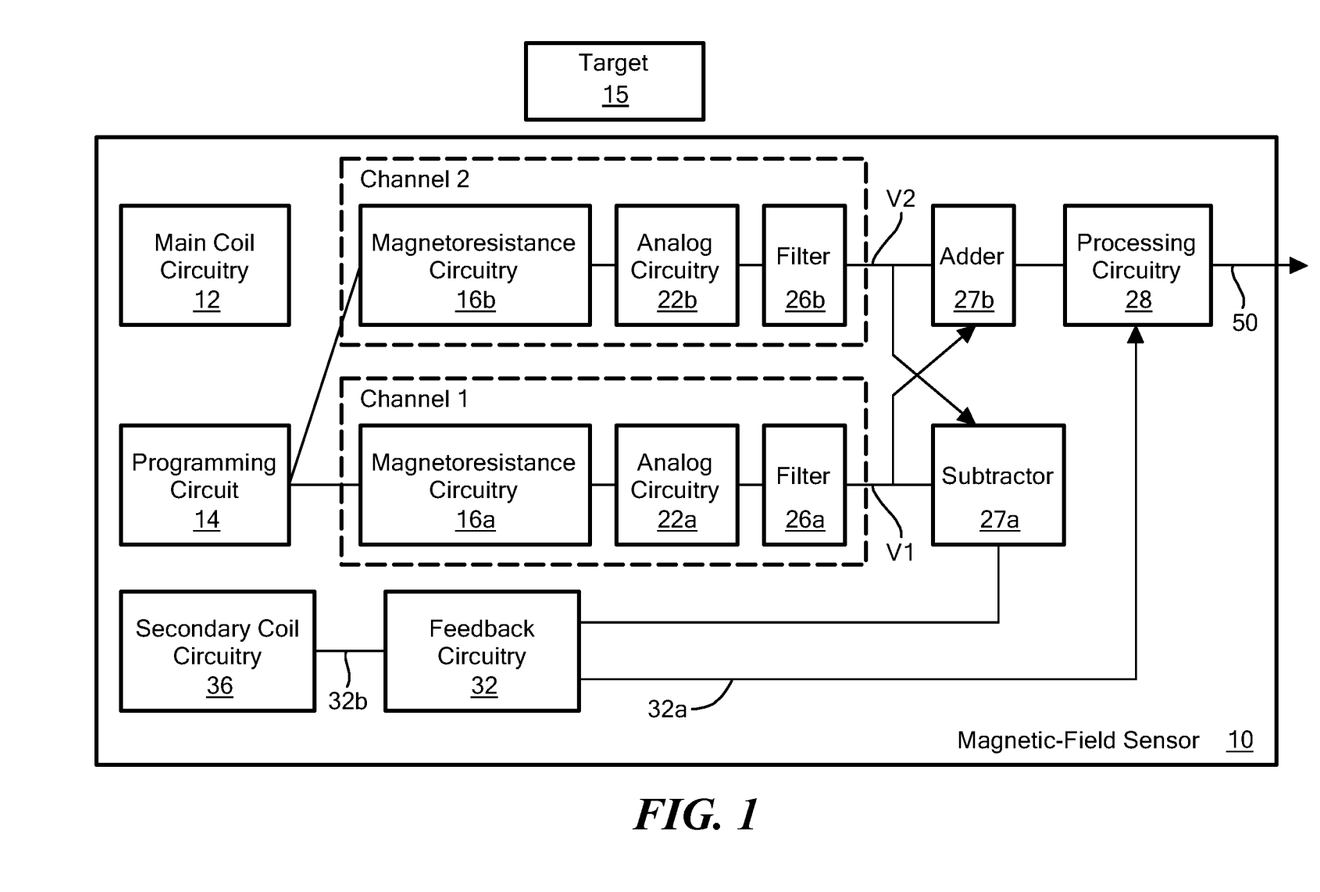
FIG. 1 is a block diagram of an example of a magnetic-field sensor to reduce stray magnetic-field effects.

Referring to FIG. 1, a magnetic-field sensor 10 includes main coil circuitry 12, programming circuit 14, a first magnetoresistance circuitry 16a, a second magnetoresistance circuitry 16b, a first analog circuitry 22a, a second analog circuitry 22b, a first filter 26a, a second filter 26b, a subtractor circuit 27a, an adder circuit 27b, processing circuitry 28, feedback circuitry 32 and secondary coil circuitry 36. In one example, the magnetic-field sensor 10 is fabricated in an integrated circuit (IC). In this example, the feedback occurs in the digital domain.

The output of the magnetic-field sensor 10 is an output signal 50. In one example, the output signal 50 indicates a position of the target 15.

The first magnetoresistance circuitry 16a, the first analog circuitry 22a and the first digital circuitry 26a form a first channel (channel 1) that has an output signal V1. The second magnetoresistance circuitry 16b, the second analog circuitry 22b and the second digital circuitry 26b form a second channel (channel 2) that has an output signal V2.

The main coil circuitry 12 is configured to generate a first magnetic field signal (e.g., DCFS) at a first frequency. The first magnetic field signal is reflected off a target 15 to form a reflected signal (e.g., RFS). In one example, the reflected signal is a function of the position of the target. The closer the target 15 is to the magnetic-field sensor 10, the larger in magnitude of the reflected signal, and the further the target 15 is to the magnetic-field sensor 10, the smaller in magnitude of the reflected signal or the reflected signal is zero.

In one example, the target 15 is a ferromagnetic target. In one example, the target 15 may be a rotating target. In some examples, the rotating target may include gear teeth.

The magnetoresistance circuitry 16a, 16b are configured to receive the reflected signal. The magnetoresistance circuitry 16a, 16b may also each receive a control signal from the programming circuit 14.

The analog circuitry 22a, 22b are configured to receive an output signal from a respective magnetoresistance circuitry 16a, 16b and to demodulate the output signal to a baseband signal. The analog circuitry 22a, 22b may also convert their respective baseband signal from an analog signal to a digital signal.

The filters 26a, 26b each receive the digital baseband signal from the respective analog circuitry 22a, 22b and filters the digital baseband signal. The filtered digital baseband signal from filter 26a is the output signal V1. The filtered digital baseband signal from the filter 26b is the output signal V2.

The subtractor circuit 27a is configured to receive the output signal V1 and the output signal V2 and to subtract the output signal V2 from the output signal V1 to form a subtraction signal, V1−V2, which is provided to the feedback circuitry 32.

The subtraction signal V1−V2 is indicative of the DCFS, which is not desired to be received by the first and second magnetoresistance circuities 16a, 16b. The feedback circuitry 32 is used to mitigate the effects of DCFS by mitigating the effects of V1−V2.

The feedback circuitry 32 provides a first feedback signal 32a to the processing circuitry 28 and a second feedback signal 32b to the secondary coil circuitry 36. In one example, the second feedback signal 32b is formed by converting the subtraction signal V1−V2 to an analog signal and modulating the analog signal to an AC signal having second frequency, which is a negative of the first frequency.

The adder circuit 27b is configured to receive the output signal V1 and the output signal V2 and to add the output signal V1 and the output signal V2 to form a summation signal, V1+V2, which is provided by the adder circuit 27*b* to the processing circuitry 28. The processing circuitry 28 provides the output signal 50. The summation signal V1+V2 is indicative of the RFS, which is desired to be received by the first and second magnetoresistance circuities 16*a*, 16*b*.

Figure 2A:
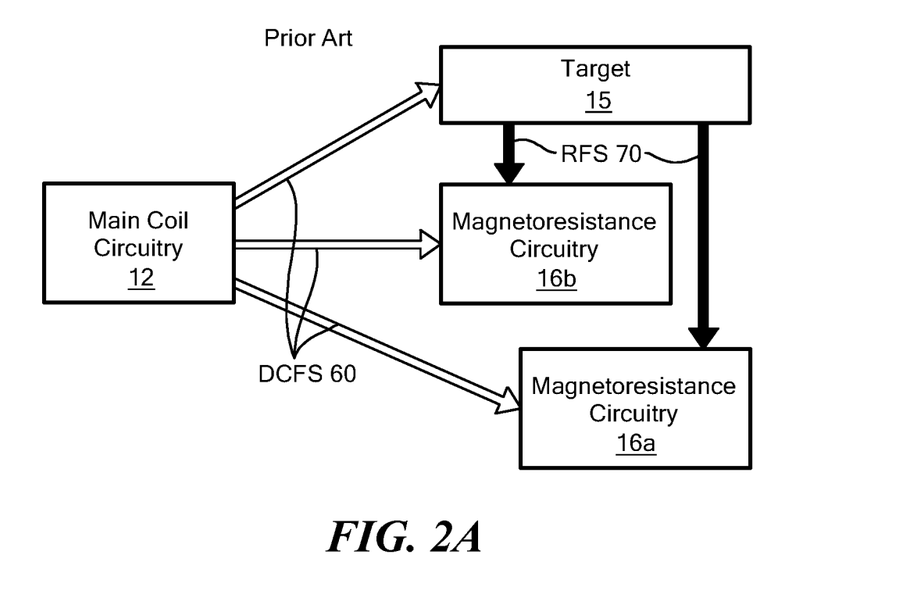
FIG. 2A is a diagram indicating magnetic-field signals received at a first magnetoresistance circuitry and a second magnetoresistance circuitry without a magnetic-field signal from a secondary coil.

As will be described further herein, the secondary coil circuitry 36 generates a magnetic-field signal that mitigates the effects of the DCFS received at the first and second magnetoresistance circuities 16*a*, 16*b*. In one example, the magnetic-field signal generated by the secondary coil 36 is a large enough magnetic-field to mitigate the effects of the DCFS received at the first and second magnetoresistance circuities 16*a*, 16*b*; but a small enough magnetic-field signal not to generate a reflected signal from the target 15, or at least a small enough magnetic-field signal not to generate a reflected signal that could be received by the first and second magnetoresistance circuities 16*a*, 16*b*. Referring to FIG. 2A, the main coil circuitry generates a DCFS 60 to the target 15 and an RCFS 70 reflected from the target 15 is received by the first magnetoresistance circuitry 16*a* and the second magnetoresistance circuitry 16*b*. However, the first magnetoresistance circuitry 16*a* and the second magnetoresistance circuitry 16*b* may also receive stray magnetic-field signals such as the DCFS 60.

Figure 2B:
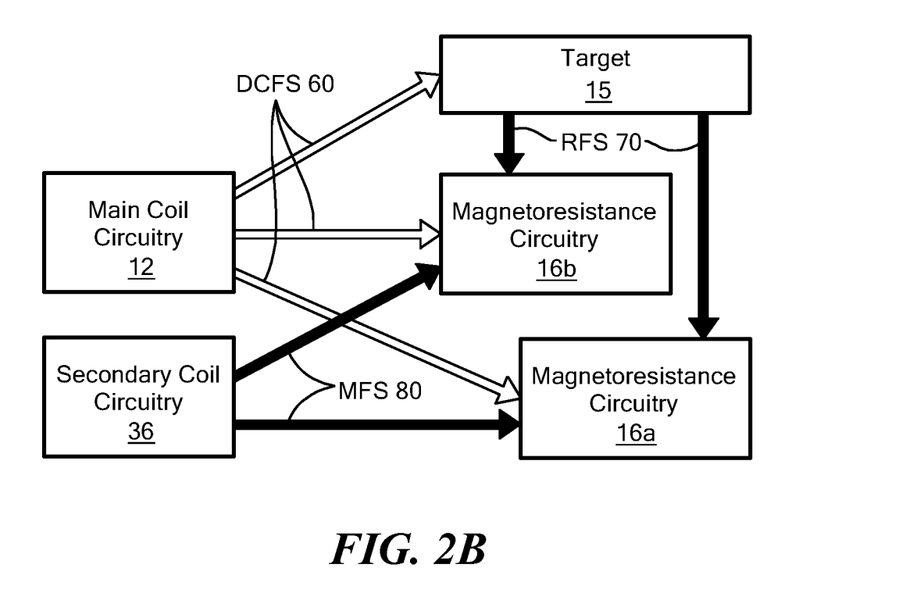
FIG. 2B is diagram indicating magnetic-field signals received at the first magnetoresistance circuitry and the second magnetoresistance circuitry with the magnetic-field signal from the secondary coil.

Referring to FIG. 2B, with the secondary coil circuitry 36 as configured in FIG. 1, in one example, a mitigating field signal (MFS) 80 may be generated to mitigate the effects of the DCFS 60 on the first magnetoresistance circuitry 16*a* and the second magnetoresistance circuitry 16*b*.

Figure 3A:
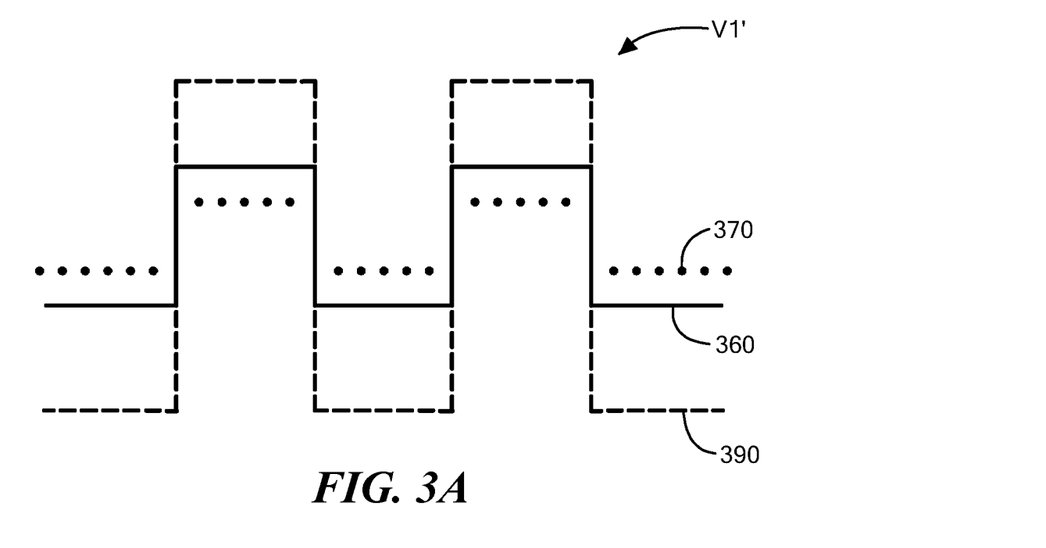
FIG. 3A is a signal diagram of an example of signals at the output of a first channel without using the secondary coil.
Figure 3B:
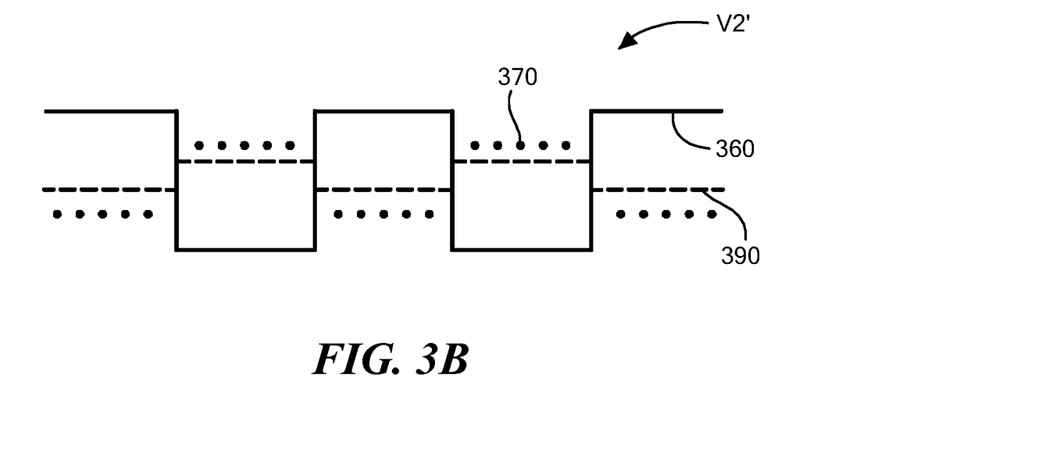
FIG. 3B is a signal diagram of an example of signals at the output of a second channel without using the secondary coil.

Referring to FIGS. 3A and 3B, without the secondary circuit 36 to emit the MFS 80, an example of the output signal V1 is an output signal V1' and an example of the output signal V2 is an output signal V2'. An example of the DCFS is DCFS 360 and an example of the RFS is the RFS 370. The combination of the DCFS 360 and the RFS 370 is a combination signal 390.

Figure 4A:
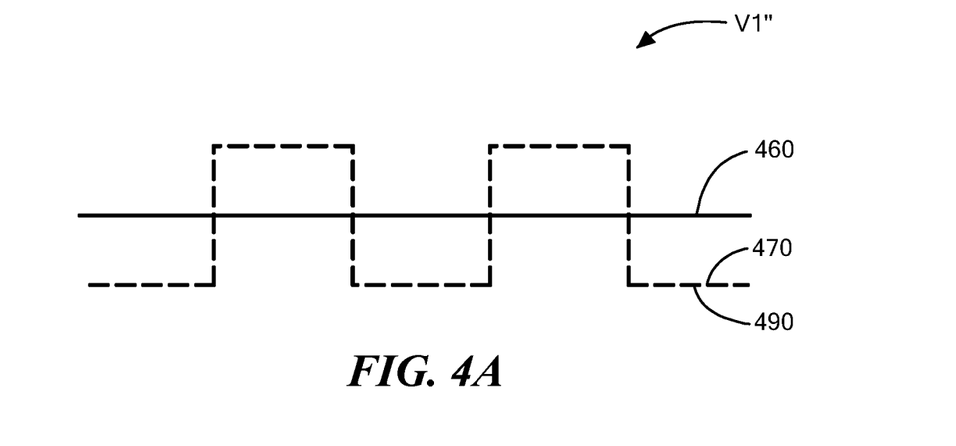
FIG. 4A is a signal diagram of an example of signals at the output of the first channel using the secondary coil.
Figure 4B:
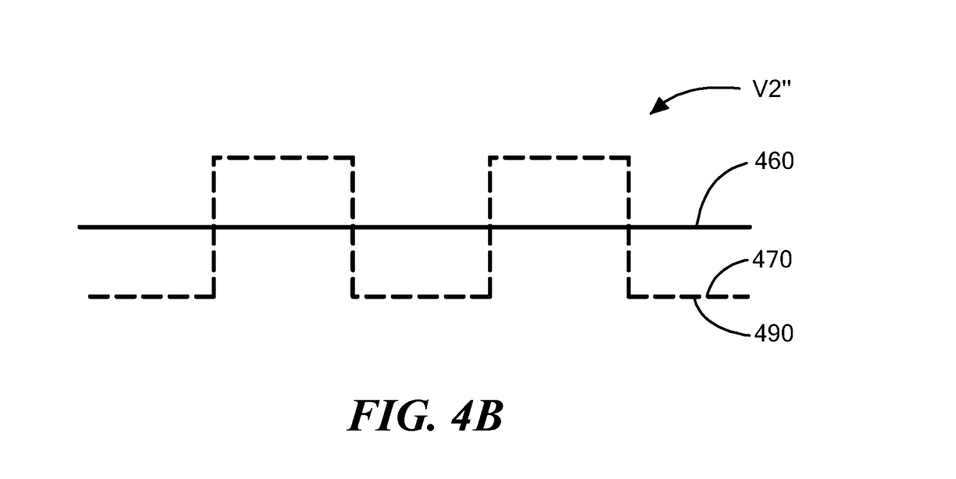
FIG. 4B is a signal diagram of an example of signals at the output of the second channel using the secondary coil.

Referring to FIGS. 4A and 4B, with the secondary circuit 36 to emit the MFS 80, an example of the output signal V1 is an output signal V1Δ and an example of the output signal V2 is an output signal V2". An example of the DCFS is DCFS 460 and an example of the RFS is the RFS 470. The combination of the DCFS 460 and the RFS 470 is a combination signal 490. As shown in FIGS. 4A and 4B, the MFS 80 mitigates the effects of the DCFS 60 on the first and second magnetoresistance circuitries 16*a*, 16*b*.

Figure 5:
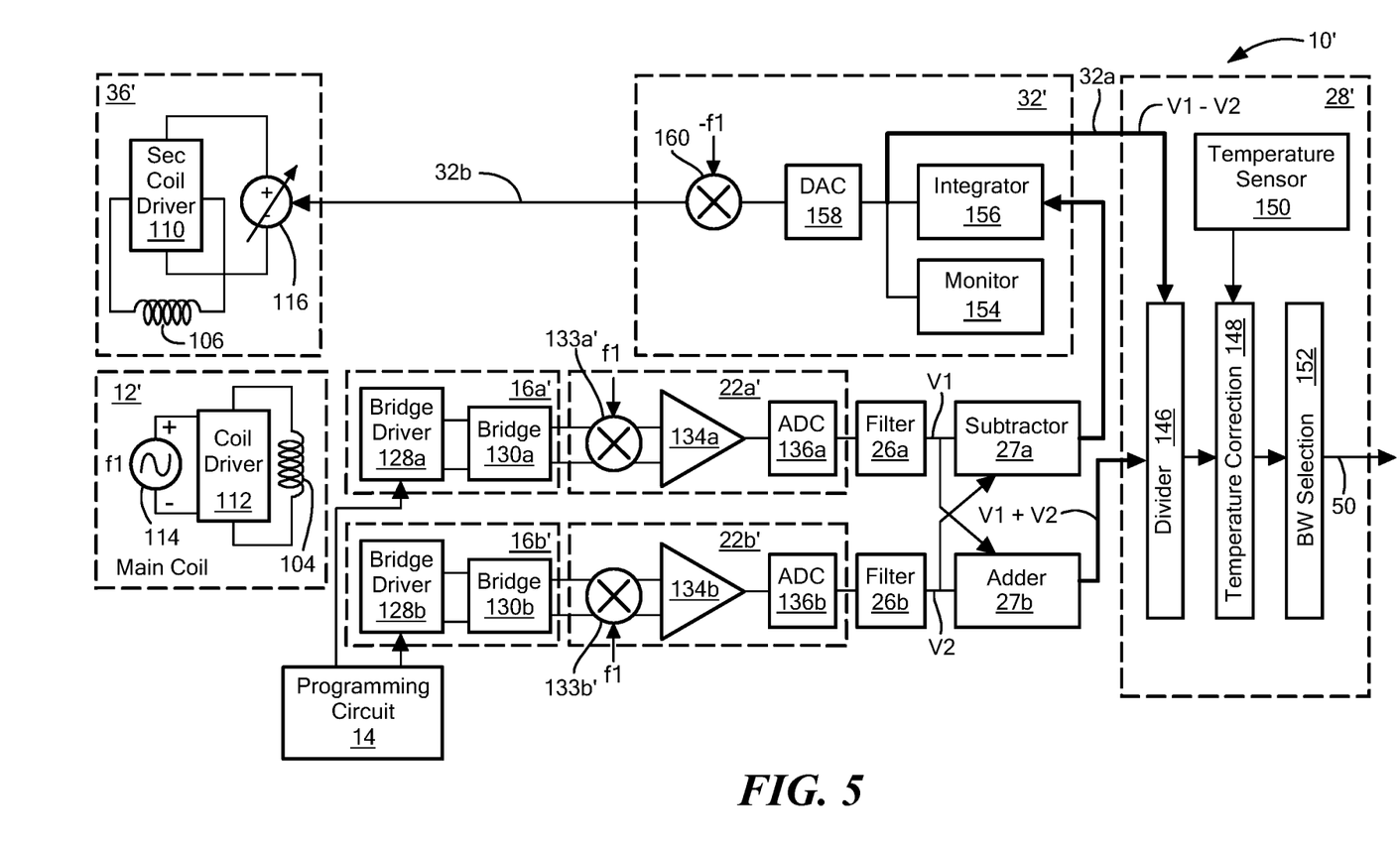
FIG. 5 is a block diagram of an example of the magnetic-field sensor of FIG. 1.

Referring to FIG. 5, an example of the magnetic-field sensor 10 is a magnetic-field sensor 10'. The magnetic-field sensor 10' includes main coil circuitry 12', the programming circuit 14, a first magnetoresistance circuitry 16*a*', a second magnetoresistance circuitry 16*b*', a first analog circuitry 22*a*', a second analog circuitry 22*b*', the first filter 26*a*, the second filter 26*b*, the subtractor circuit 27*a*, the adder circuit 27*b*, processing circuitry 28', feedback circuitry 32' and secondary coil circuitry 36'.

The main coil circuitry 12' is an example of the main coil circuitry 12. In one example, the main coil circuitry 12' may include a main coil 104, a coil driver 112 and a source 114 (e.g., a current source or a voltage source). The source 114 provides an AC current at the first frequency f1. In one example, the first frequency f1 is between 1 and 8 MHz. The AC current provided by the coil driver circuit 112 powers the main coil 104 to generate a magnetic field signal (e.g., the DCF signal 60).

The first magnetoresistance circuitry 16*a*' is an example of the magnetoresistance circuitry 16*a*. In one example, the magnetoresistance circuitry 16*a*' includes magnetoresistance elements arranged in a bridge 130*a* and a bridge driver 128*a* that drives the bridge 130*a*. The magnetoresistance elements in the bridge 130*a* receive the reflected field signal, which is converted into an output signal.

The second magnetoresistance circuitry 16*b*' is an example of the magnetoresistance circuitry 16*b*. In one example, the magnetoresistance circuitry 16*b*' includes magnetoresistance elements arranged in a bridge 130*b* and a bridge driver 128*b* that drives the bridge 130*b*. The magnetoresistance elements in the bridge 130*b* receive the reflected field signal, which is converted into an output signal. In one example, programming circuit 14 controls the bridge drivers 128*a*, 128*b*.

The first analog circuitry 22*a*' is an example of the first analog circuitry 22*a*. In one example, the analog circuitry 22*a*' may include a mixer 133*a*, an amplifier 134*a* and an analog-to-digital converter (ADC) 136*a*.

The mixer 133*a* receives the output signal from the first magnetoresistance circuitry 16*a*' and demodulates the output signal with the first frequency f1 to form a baseband signal. The baseband signal is amplified by the amplifier 134*a*. The amplified baseband signal is converted from an analog signal to a digital signal by the ADC 136*a*. In one example, the ADC 136*a* may be a sigma-delta ADC.

The second analog circuitry 22*b*' is an example of the second analog circuitry 22*b*. In one example, the second analog circuitry 22*b*' may include a mixer 133*b*, an amplifier 134*b* and an ADC 136*b*.

The mixer 133*b* receives the output signal from the second magnetoresistance circuitry 16*b*' and demodulates the output signal with the first frequency f1 to form a baseband signal. The baseband signal is amplified by the amplifier 134*b*. The amplified baseband signal is converted from an analog signal to a digital signal by the ADC 136*b*. In one example, the ADC 136*b* may be a sigma-delta ADC.

In one example, the filters 26*a*, 26*b* may include a cascaded integrator-comb (CIC) filter and a low pass filter (not shown). For example, the CIC filter filters the digital baseband signal from the respective ADC 136*a*, 136*b*. The low pass filters may be configured to filter noise and other artifacts from an output of the CIC filters to produce the output signals V1 and V2, respectively.

The processing circuitry 28' is an example of the processing circuit 28. The processing circuitry 28' includes a divider circuit 146, a temperature correction circuit 148, a temperature sensor 150 and a bandwidth (BW) selection circuit 152.

The divider circuit 145 receives the summation signal V1+V2 from the adder circuit 27*b*. The divider circuit 145 also receives the first feedback signal V1−V2 from the feedback circuitry 32'. The divider circuit 145 divides the signal output of the adder circuit 27*b* by the first feedback signal to produce a normalized signal P, where P=(V1+V2)/(V1−V2). The normalized signal P compensates for temperature drifts and stray field effects between the two bridges 130*a*, 130*b*.

The temperature correction circuit 148 may scale the output voltage signal P according to temperature (e.g., a temperature measured by the temperature sensor 150). The BW selection circuit 152 provides a further low-pass filtering with a selectable cut off frequency to generate the output signal 50.

The feedback circuitry 32' is an example of the feedback circuitry 32. In one example, the feedback circuitry 32' includes a monitor 154, an integrator 156, a digital-to analog converter (DAC) 158 and a mixer 160.

The integrator 156 accumulates the output signal from the subtractor circuit 27*a*, which represents the error signal V1−V2 or DCFS 60. The output of the integrator 156 is provided as the first feedback signal 32a to the divider circuit 146. The monitor 154 monitors the output signal from the integrator 156.

The DAC 158 receives the output signal from the integrator 156 and converts the digital output signal to an analog signal. In one example, the analog signal is a current signal. In another example, the analog signal is a voltage signal. The analog signal from the DAC 158 is provided to the mixer 160. The mixer 160 mixes the analog signal with a negative of the first frequency or −f1 to form an AC signal or second feedback signal 32b. The second feedback signal 32b is provided to the secondary coil circuitry 36'.

The secondary coil circuitry 36' is an example of the secondary coil circuitry 36. In one example, the secondary coil circuitry 36' includes a secondary coil 106, a secondary coil driver 110 and a source 116 (e.g., a current source or a voltage source). The second feedback signal 32b is received by the source 116. The secondary coil driver circuit 112 provides power to the secondary coil 106 to produce a magnetic field signal (e.g., MF 80) based on a signal received by the source 116.

Figure 6:
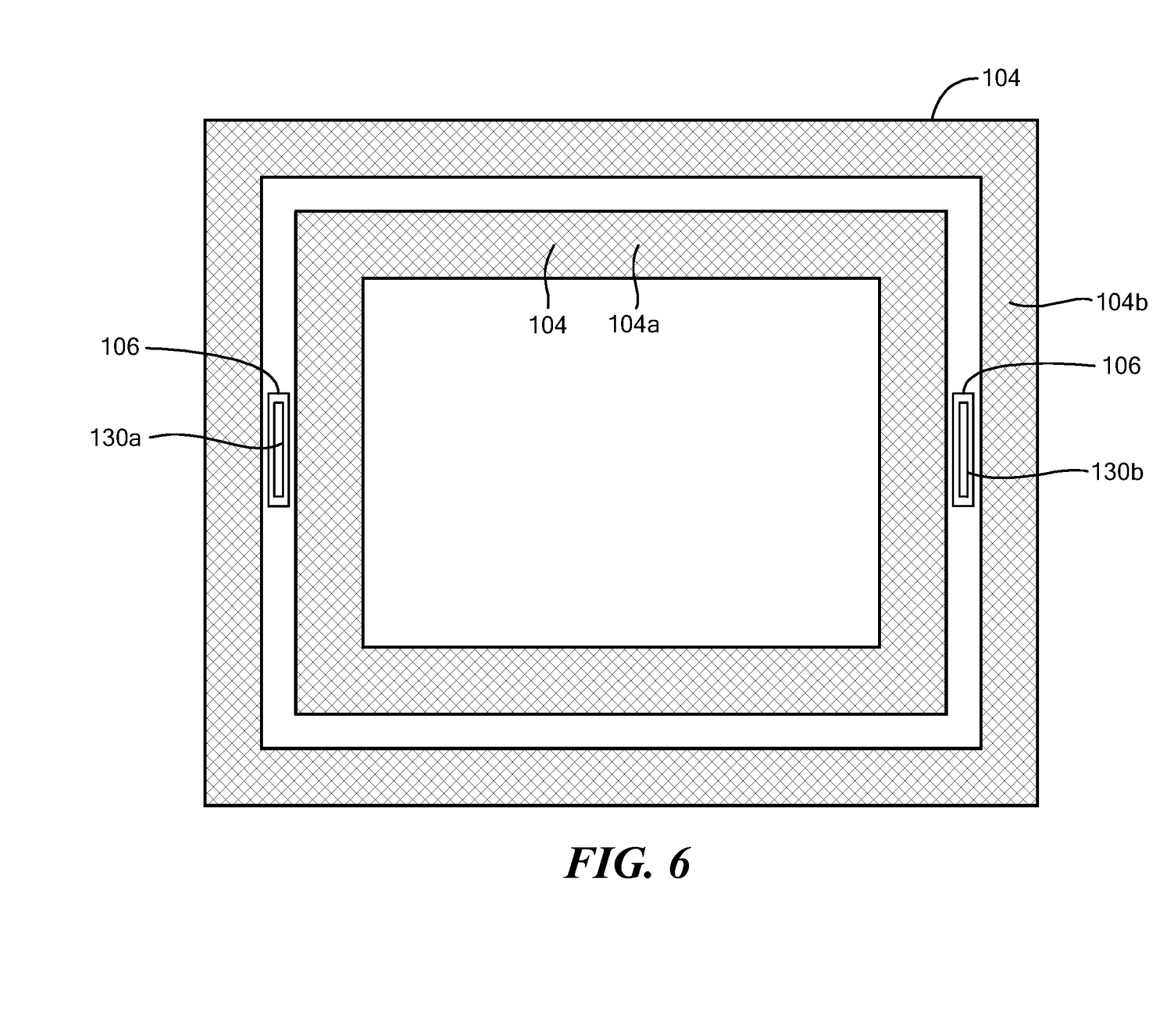
FIG. 6 is a diagram of bridges with a main coil and a secondary coil.

Referring to FIG. 6, the main coil 104 includes inner loops 104a and outer loops 104b. For simplicity, each loop within the inner loops 104a and the outer loops 104b is not depicted. The bridges 130a, 130b may be positioned between the inner loops 104a and the outer loops 104b. In one example, the bridge 130a may be disposed at one end of the main coil 122 and the bridge 130b may be disposed at the other end of the main coil 104.

In one example, a number of inner loops 104a differ from a number of outer loops 104b by no more than one loop. In another example, the number of inner loops 104a is equal to the number of outer loops 104b.

The secondary coil 106 surrounds the bridges 130a, 130b. The secondary coil 106 is between the magnetoresistance elements bridges 130a, 130b and the main coil 104. A distance between the secondary coil 106 to the bridges 130a, 130b is smaller than a distance between the main coil 104 to the bridges 130a, 130b. The coupling factor of the secondary coil is about 10 to 20 times the main coil coupling factor because the secondary coil 106 is much closer to the bridges 130a, 130b than the main coil 104. Thus, compensating for the DCFS is not expensive in terms of area consumed on an integrated circuit and or the amount of power consumed.

In one example, the secondary coil 106 is wound in a first direction and the main coil is wound in a second direction opposite the first direction. In one example, the first direction is clockwise. In another example, the first direction is counterclockwise. In another example, the secondary coil 106 is wound in a direction that reduces the error signal.

Figure 7:
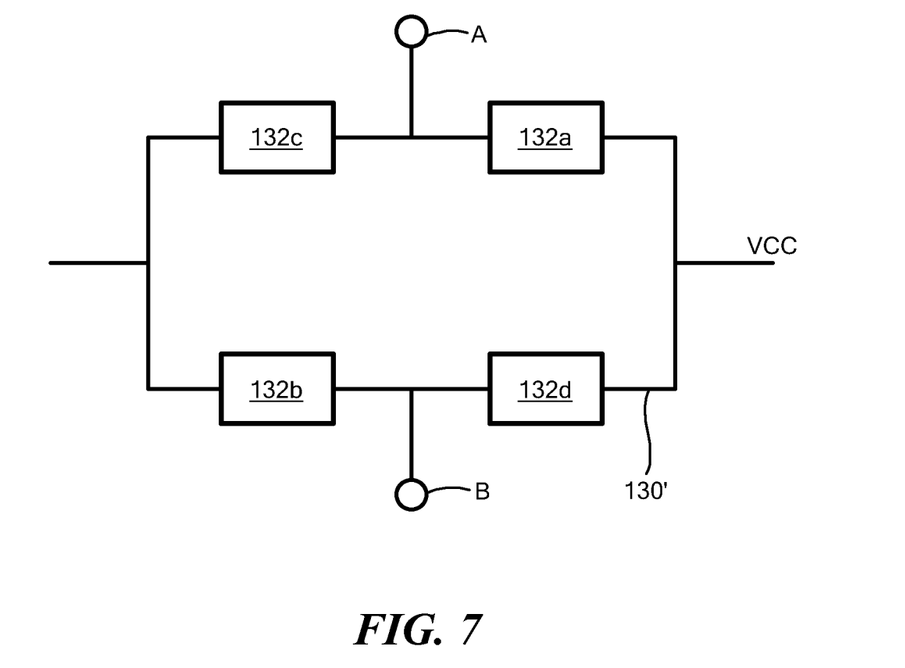
FIG. 7 is a circuit diagram of an example of a bridge configuration.

In other embodiments, a secondary coil does not enclose the bridges 130a, 130b. For example, the secondary coil is disposed nearby but does not enclose the bridges 130a, 130b. Referring to FIG. 7, an example of the bridges 130a, 130b is a bridge 130'. The bridge 130' may include a magnetoresistance element 132a, a magnetoresistance element 132b, a magnetoresistance element 132c, and a magnetoresistance element 132d. The magnetoresistance elements 132a-132d may be GMR elements and/or TMR elements.

The magnetoresistance elements 132a, 132c are connected in electrical series on one leg of the bridge 30', and the magnetoresistance elements 132b, 132d are connected in series on the other leg of the bridge 30', which is electrically in parallel with the magnetoresistance elements 132a, 132c.

A node A is between the magnetoresistance elements 132a, 132c and a node B is between the magnetoresistance elements 132b, 132d. In one particular example, a voltage difference between the nodes A and B produces an output voltage signal. The bridge 30' may be one of a voltage bridge, a resistance bridge, a current bridge, or a conductance bridge.

Figure 8:
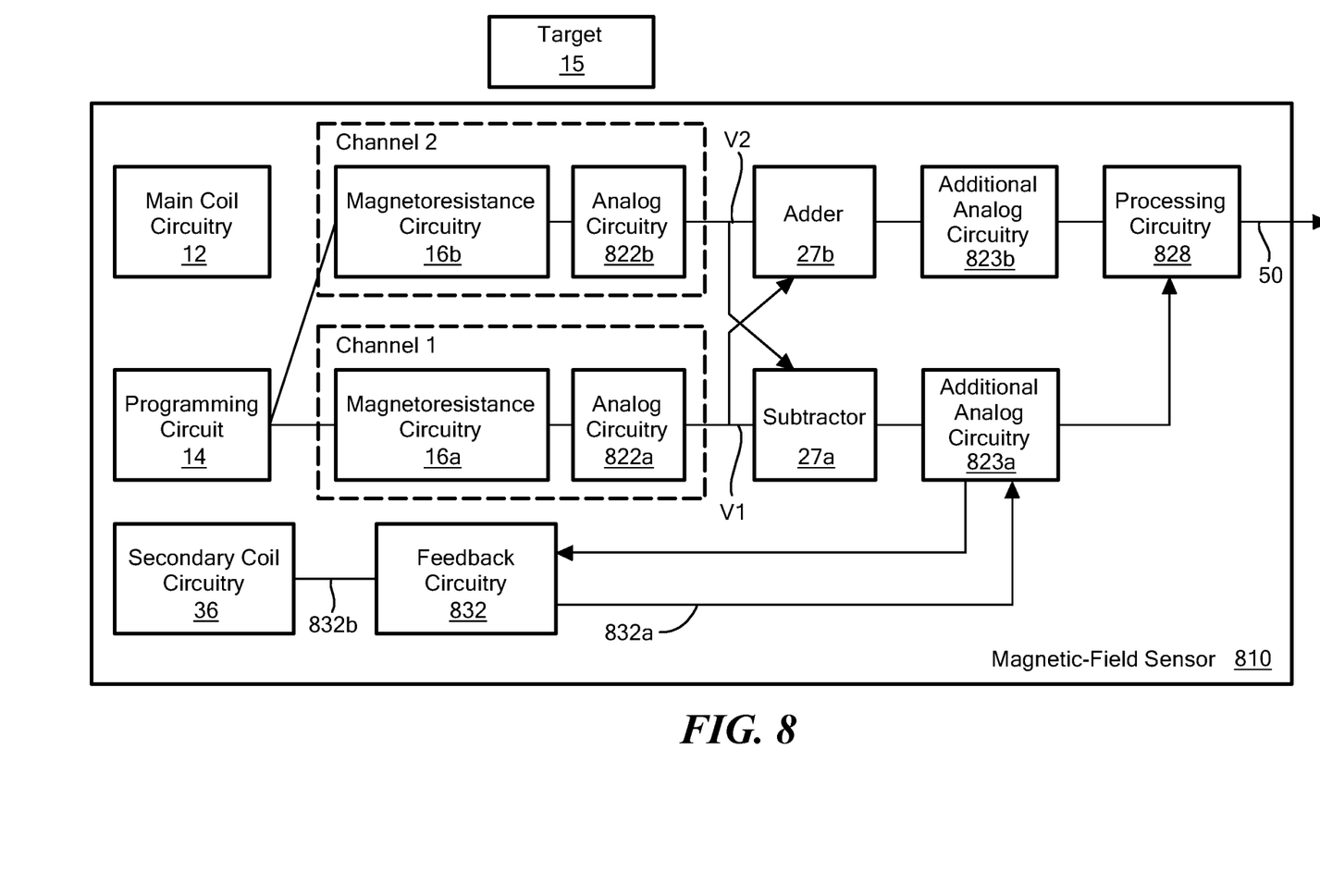
FIG. 8 is block diagram of another example of a magnetic-field sensor to reduce stray magnetic-field effects.

Referring to FIG. 8, the magnetic-field sensor may be fabricated in other configurations. For example, a magnetic-field sensor 800 is similar to the magnetic-field sensor 10 except the feedback circuitry is connected to analog circuitry instead of the digital circuitry and thus the feedback is from the analog domain as opposed to the digital domain as shown in FIG. 1. The magnetic-field sensor 810 includes main coil circuitry 12, programming circuit 14, a first magnetoresistance circuitry 16a, a second magnetoresistance circuitry 16b, a first analog circuitry 22a, a second analog circuitry 22b, a first additional analog circuitry 823a, a second additional analog circuitry 823b, the subtractor circuit 27a, the adder circuit 27b, processing circuitry 828, feedback circuitry 832 and secondary coil circuitry 36.

In this configuration, an output of the first analog circuitry 822a is connected to the adder circuit 27b and an output of the second analog circuitry 822b is connected to the subtractor circuit 27a. The output of the first analog circuitry 822a is the output of the first channel, V1 and the output of the second analog circuitry 822b is the output of the second channel, V2.

The first additional analog circuitry 823a receives an output signal from the subtractor circuit 27a and provides a first output signal to the feedback circuitry 832. The second additional analog circuitry 823b receives an output from the adder circuit 27b and provides an output to the processing circuitry 828.

The feedback circuitry 832 provides a first feedback signal 832a back to the first additional analog circuitry 823a and a second feedback signal 832b to the secondary coil circuitry 36. The additional analog circuitry 823a provides a second output signal to the processing circuitry 828, which provides the output signal 50.

Figure 9:
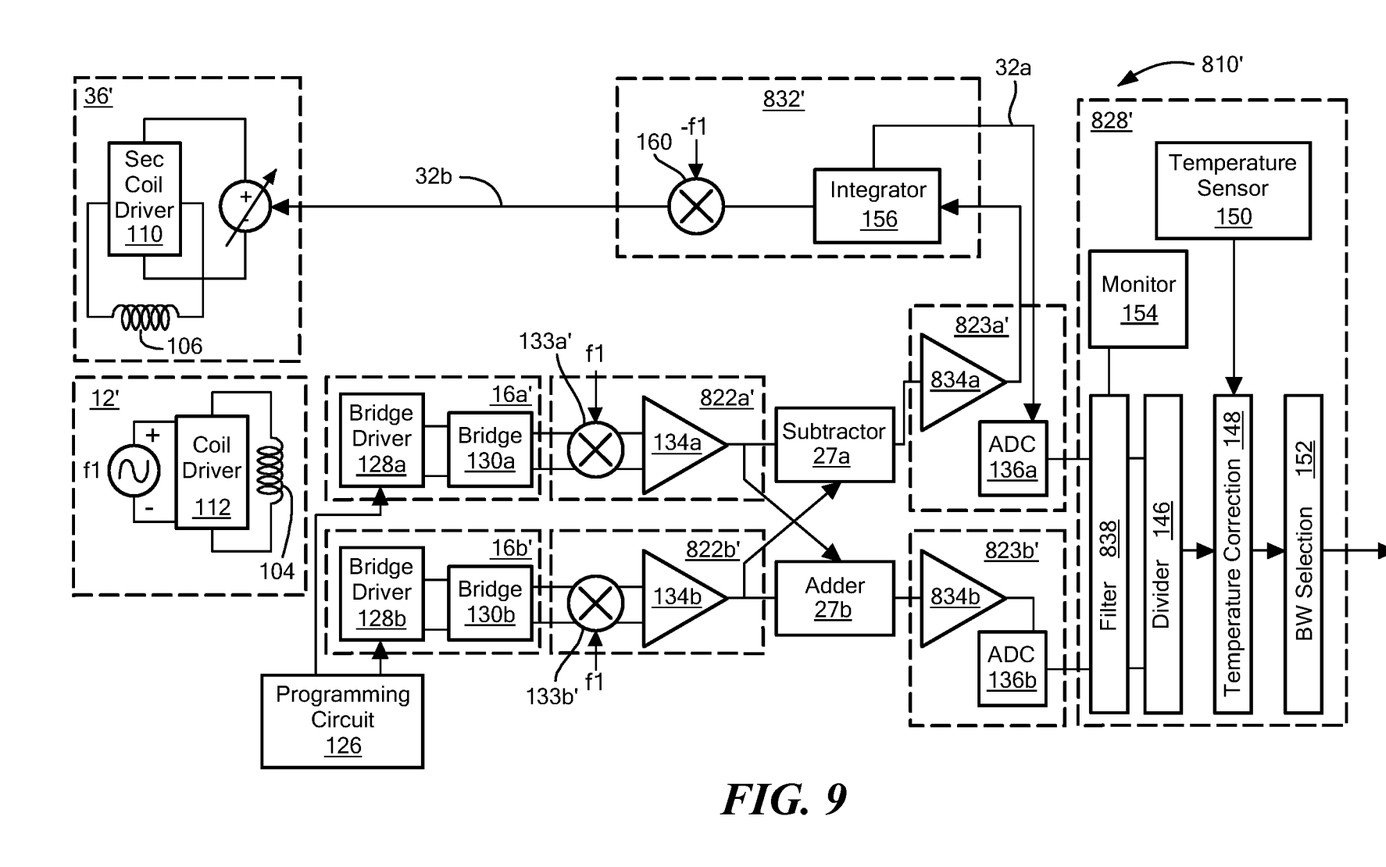
FIG. 9 is a block diagram of an example of the magnetic-field sensor of FIG. 8.

Referring to FIG. 9, an example of the magnetic-field sensor 810 is a magnetic-field sensor 810'. The magnetic-field sensor 10' includes the main coil circuitry 12', the programming circuit 14, the first magnetoresistance circuitry 16a', the second magnetoresistance circuitry 16b', a first analog circuitry 822a', a second analog circuitry 822b', a first additional analog circuitry 823a, a second additional analog circuitry 823b, the subtractor circuit 27a, the adder circuit 27b, processing circuitry 828', feedback circuitry 832' and the secondary coil circuitry 36'.

The first analog circuitry 822a' is an example of the first analog circuitry 822a. The first analog circuitry 822a' includes the mixer 133a and the amplifier 134a.

The second analog circuitry 822b' is an example of the second analog circuitry 822b. The second analog circuitry 822a' includes the mixer 133b and the amplifier 134b.

The first additional analog circuitry 823a' is an example of the first additional analog circuitry 823a. The first additional analog circuitry 823a' includes an amplifier 834a and the ADC 136a. An input of the amplifier 834a receives a summation signal from the subtractor circuit 27a. An output signal of the amplifier 834a is provided to the feedback circuitry 832. The first feedback signal 32a is received by the ADC 136a.

The second additional analog circuitry 823b' is an example of the second additional analog circuitry 823b. The second additional analog circuitry 823b' includes an amplifier 834b and the ADC 136a. An input of the amplifier 834b receives a summation signal from the adder circuit 27b and provides an output to the ADC 136b.

The processing circuitry 828a' is an example of the processing circuit 828a. The processing circuit 828' includes a filter 838, the divider 146, the temperature correction circuit 148, the temperature sensor 150, the BW selection 152 and the monitor 154.

The filter 838 receives the output of the ADC 136a, which is V1−V2 and indicative of the DCF signal 60. The filter 838 also receives the output of the ADC 136b, which is V1+V2 and indicative of the RF signal 70.

In one example, the filter 838 may include at least one cascaded integrator-comb (CIC) filter and at least one low pass filter (not shown). For example, the CIC filter filters the digital baseband signal from the respective ADC 136a, 136b. The low pass filter may be configured to filter noise and other artifacts from an output of the CIC filter. The filter provides a signal V1−V2 and a signal V1+V2 to the divider 146 and the divider provides the normalized signal P=(V1+V2)/(V1−V2). In one example, the monitor 154 monitors the signals at the filter 838.

The feedback circuitry 832' is an example of the feedback circuitry 832. In one example, the feedback circuitry 832' includes the integrator 156 and the mixer 160. The integrator 156 receives the output the amplifier 834a and provides an output signal to the mixer 160. The integrator 156 provides the first feedback signal 32a to the ADC 136a and the second feedback signal to the secondary coil circuitry 36'.

Figure 10:
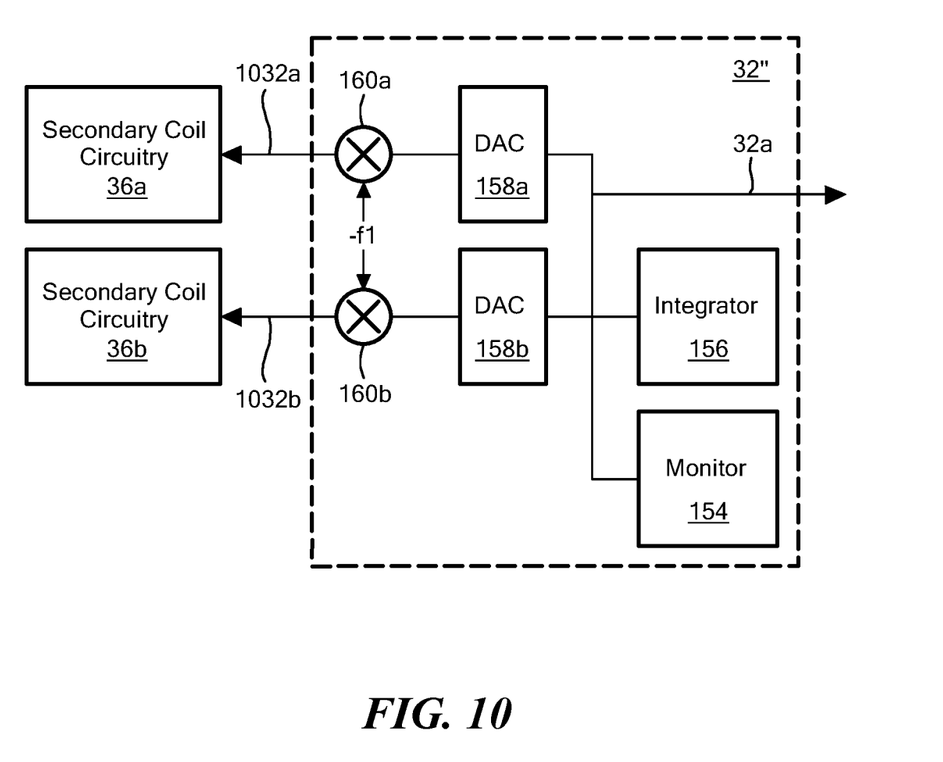
FIG. 10 is a block diagram of another example of a feedback circuitry used in FIG. 5 to reduce the effects of the stray magnetic-field effects.

Referring to FIG. 10, in other embodiments, a second secondary coil circuitry may be added so that each magnetoresistance circuitry has a dedicated secondary coil circuitry. For example, the feedback circuitry 32' in FIG. 5 would be replaced by the feedback circuitry 32" and the secondary coil circuitry 36 would be replaced by two secondary coil circuitries (e.g., a first secondary coil circuitry 36a and a second secondary coil circuitry 36b). The DAC 158 would be replaced by a first DAC 158a and a second DAC 158b. The mixer 160 would be replaced by a first mixer 160a and a second mixer 160b.

In this configuration, the first and second DACs 158a, 158b receive the output of the integrator 156. Each DAC 158a, 158b provides an output signal to a respective mixer 160a, 160b. For example, the mixer 160a modulates the output signal from the DAC 158a at −f1 frequency and provides a feedback signal 1032a as an input to the first secondary coil circuitry 36a. For example, the mixer 160b modulates the output signal from the DAC 158b at −f1 frequency and provides a feedback signal 1032b as an input to the first secondary coil circuitry 36b.

One of ordinary skill in the art would recognize that feedback circuitry 32" may be implemented with respect to FIG. 9. For example, feedback circuitry 32" may replace feedback circuitry 832 except the two DACs 158a, 158b are not used.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic-field sensor comprising:
   main coil circuitry configured to generate a first magnetic-field signal at a first frequency, wherein a reflected signal is generated from a target caused by the first magnetic-field signal;
   a first channel comprising:
      a first magnetoresistance circuitry configured to receive the reflected signal and the first magnetic-field signal;
      a first analog circuitry configured to receive an output signal from the first magnetoresistance circuitry; and
      a first filter configured to receive an output signal from the first analog circuitry and to provide a first channel output signal;
   a second channel comprising:
      a second magnetoresistance circuitry configured to receive the reflected signal and the first magnetic-field signal;
      a second analog circuitry configured to receive an output signal from the second magnetoresistance circuitry; and
      a second filter configured to receive an output signal from the second analog circuitry and to provide a second channel output signal;
   a subtractor circuit configured to subtract the second channel output signal from the first channel output signal to form a subtraction signal;
   an adder circuit configured to combine the first channel output signal and the second channel output signal to form a summation signal;
   processing circuitry configured to receive the summation signal and to provide a magnetic-field sensor output signal indicating a position of the target;
   feedback circuitry configured to receive the subtraction signal and to provide a first feedback signal to the processing circuitry and a second feedback signal to secondary coil circuitry; and
   the secondary coil circuitry configured to receive the second feedback signal and to generate, based on the second feedback signal, a second magnetic-field signal to reduce the first magnetic-field signal received at the first magnetoresistance circuitry.

2. The magnetic-field sensor of claim 1, wherein the second magnetic field signal reduces the first magnetic-field signal received at the first and the second magnetoresistance circuitries.

3. The magnetic-field sensor of claim 1, wherein the first and second magnetoresistance circuitries each comprises a bridge comprising magnetoresistance elements.

4. The magnetic-field sensor of claim 3, wherein the magnetoresistance elements comprise at least one tunneling magnetoresistance element (TMR).

5. The magnetic-field sensor of claim 3, wherein the magnetoresistance elements comprise at least one giant magnetoresistance element (GMR).

6. The magnetic-field sensor of claim 3, wherein the main coil circuitry comprises a first coil having inner loops and outer loops,
   wherein a number of the inner loops differ from a number of the outer loops by no more than one loop, and
   wherein the magnetoresistance elements are disposed between the inner loops and the outer loops.

7. The magnetic-field sensor of claim 6, wherein the number of the inner loops is equal to the number of the outer loops.

8. The magnetic-field sensor of claim 6, wherein the second coil circuitry comprises a second coil, and
wherein the magnetoresistance elements are within the second coil.

9. The magnetic-field sensor of claim 8, wherein a distance between the second coil to the magnetoresistance elements is smaller than a distance between the first coil to the magnetoresistance elements.

10. The magnetic-field sensor of claim 8, wherein the second coil is wound in a first direction and the first coil is wound in a second direction opposite the first direction.

11. The magnetic-field sensor of claim 6, wherein the second coil circuitry comprises a second coil, and
wherein a distance between the second coil to the magnetoresistance elements is smaller than a distance between the first coil to the magnetoresistance elements.

12. The magnetic field sensor of claim 3, wherein the bridge is one of a voltage bridge, a current bridge, a resistance bridge or a conductance bridge.

13. The magnetic-field sensor of claim 1, wherein the feedback circuitry comprises a mixer configured to convert the subtraction signal from a baseband signal to an alternating current (AC) signal having a frequency equal to negative of the first frequency and to provide the AC signal to the secondary coil circuitry.

14. The magnetic-field sensor of claim 13, wherein the feedback circuitry further comprises:
an integrator configured to receive the subtraction signal;
a digital-to-analog converter (DAC) configured to receive an output signal from the integrator, to convert the output signal, from the DAC, from a digital signal to an analog signal and to provide the analog signal to the mixer.

15. The magnetic-field sensor of claim 13, wherein the first and second analog circuitries each comprises a mixer, wherein the mixer converts the output signal from the respective magnetoresistance circuitry into the baseband signal.

16. The magnetic-field sensor of claim 15, wherein the first and second analog circuitries each further comprises an amplifier that amplifies the baseband signal received from the respective mixer.

17. The magnetic-field sensor of claim 15, wherein the first and second analog circuitries each further comprises an analog-to-digital (ADC) converter configured to convert an output of the mixer to a digital signal and to provide the digital signal to a respective filter.

18. The magnetic-field sensor of claim 1, wherein the magnetic-field sensor is fabricated in an integrated circuit.

19. The magnetic-field sensor of claim 1, wherein the secondary coil circuitry is a first secondary coil circuitry,
further comprising a second secondary coil circuitry configured to receive a third feedback signal from the feedback circuitry and to generate, based on the third feedback signal, a third magnetic field signal to reduce the first magnetic-field signal received at the second magnetoresistance circuitry.

20. The magnetic-field sensor of claim 1, wherein the feedback circuit comprises:
an integrator configured to receive the subtraction signal;
a first digital-to analog converter (DAC) configured to receive an output of the integrator;
a second DAC configured to receive the output of the integrator;
a first mixer configured to receive the output of the first DAC and to provide the second feedback signal to the first magnetoresistance circuitry; and
a second mixer configured to receive the output of the second DAC and to provide the third feedback signal to the second magnetoresistance circuitry.

21. The magnetic-field sensor of claim 1, wherein the second magnetic-field signal does not generate a reflected signal from the target.

22. A magnetic-field sensor comprising:
main coil circuitry configured to generate a first magnetic-field signal at a first frequency, wherein a reflected signal is generated from a target caused by the first magnetic-field signal;
a first channel comprising:
a first magnetoresistance circuitry configured to receive the reflected signal and the first magnetic-field signal; and
a first analog circuitry configured to receive an output signal from the first magnetoresistance circuitry and to provide a first channel output signal;
a second channel comprising:
a second magnetoresistance circuitry configured to receive the reflected signal and the first magnetic-field signal; and
a second analog circuitry configured to receive an output signal from the second magnetoresistance circuitry and to provide a second channel output signal;
a subtractor circuit configured to subtract the second channel output signal from the first channel output signal to form a subtraction signal;
an adder circuit configured to combine the first channel output signal and the second channel output signal to form a summation signal;
a first additional analog circuitry configured to receive the subtraction signal and to provide a first digital output signal to processing circuitry and to provide an analog signal to feedback circuitry;
a second additional analog circuitry configured to receive the summation signal and to provide a second digital output signal to the processing circuitry;
the feedback circuitry configured to receive the analog signal and to provide a first feedback signal to the first additional analog circuitry and a second feedback signal to secondary coil circuitry;
the secondary coil circuitry configured to receive the second feedback signal and to generate, based on the second feedback signal, a second magnetic-field signal to reduce the first magnetic-field signal received at the first magnetoresistance circuitry; and
the processing circuitry configured to receive the first and second digital signals and to provide a magnetic-field sensor output signal indicating a position of the target.

23. The magnetic-field sensor of claim 22, wherein the second magnetic field signal reduces the first magnetic-field signal received at the first and the second magnetoresistance circuitries.

24. The magnetic-field sensor of claim 22, wherein the first and second magnetoresistance circuitries each comprises a bridge comprising magnetoresistance elements.

25. The magnetic-field sensor of claim 24, wherein the magnetoresistance elements comprise a tunneling magnetoresistance element (TMR) or one giant magnetoresistance element (GMR).

26. The magnetic-field sensor of claim 24, wherein the main coil circuitry comprises a first coil having inner loops and outer loops,
wherein a number of the inner loops differ from a number of the outer loops by no more than one loop, and
wherein the magnetoresistance elements are disposed between the inner loops and the outer loops.

27. The magnetic-field sensor of claim 26, wherein the number of the inner loops is equal to the number of the outer loops.

28. The magnetic-field sensor of claim 27, wherein the second coil circuitry comprises a second coil, and
wherein the magnetoresistance elements are within the second coil.

29. The magnetic-field sensor of claim 28, wherein a distance between the second coil to the magnetoresistance elements is smaller than a distance between the first coil to the magnetoresistance elements.

30. The magnetic-field sensor of claim 28, wherein the second coil is wound in a first direction and the first coil is wound in a second direction opposite the first direction.

31. The magnetic field sensor of claim 24, wherein the bridge is one of a voltage bridge, a current bridge, a resistance bridge, or a conductance bridge.

32. The magnetic-field sensor of claim 22, wherein the feedback circuitry comprises:
an integrator configured to receive the subtraction signal;
a mixer configured to convert the subtraction signal, received from the integrator, from a baseband signal to an alternating current (AC) signal having a frequency equal to negative of the first frequency and to provide the AC signal to the secondary coil circuitry.

33. The magnetic-field sensor of claim 32, wherein the first and second analog circuitries each comprises:
a mixer, wherein the mixer converts the output signal from the respective magnetoresistance circuitry into the baseband signal; and
an amplifier that amplifies the baseband signal received from the respective mixer.

34. The magnetic-field sensor of claim 22, wherein the first and second additional analog circuitries each comprises an analog-to-digital (ADC) converter configured to convert an output of the mixer to a digital signal and to provide the digital signal to a respective filter.

35. The magnetic-field sensor of claim 22, wherein the magnetic-field sensor is fabricated in an integrated circuit.

36. The magnetic-field sensor of claim 22, wherein the secondary coil circuitry is a first secondary coil circuitry,
further comprising a second secondary coil circuitry configured to receive a third feedback signal from the feedback circuitry and to generate, based on the third feedback signal, a third magnetic field signal to reduce the first magnetic-field signal received at the second magnetoresistance circuitry.

37. The magnetic-field sensor of claim 36, wherein the feedback circuit comprises:
an integrator configured to receive the subtraction signal;
a first mixer configured to receive the output of the integrator and to provide the second feedback signal to the first magnetoresistance circuitry; and
a second mixer configured to receive the output of the integrator and to provide the third feedback signal to the second magnetoresistance circuitry.

38. The magnetic-field sensor of claim 22, wherein the second magnetic-field signal does not generate a reflected signal from the target.

* * * * *

UNITED STATES PATENT AND TRADEMARK OFFICE
CERTIFICATE OF CORRECTION

PATENT NO. : 11,467,235 B1
APPLICATION NO. : 17/333235
DATED : October 11, 2022
INVENTOR(S) : Hernán D. Romero et al.

It is certified that error appears in the above-identified patent and that said Letters Patent is hereby corrected as shown below:

In the Specification

Column 2, Line 62 delete "FIG. 2B is diagram" and replace with --FIG. 2B is a diagram--.

Column 3, Line 13 delete "FIG. 8 is block diagram" and replace with --FIG. 8 is a block diagram--.

Column 3, Line 33 delete "However, the at" and replace with --However, at--.

Column 4, Line 44 delete "filters" and replace with --filter--.

Column 5, Line 39 delete "V1Δ" and replace with --V1"--.

Column 6, Line 63 delete "digital-to analog" and replace with --digital-to-analog--.

Column 7, Line 44 delete "and or" and replace with --and/or--.

Signed and Sealed this
Twenty-sixth Day of December, 2023

Katherine Kelly Vidal
*Director of the United States Patent and Trademark Office*